United States Patent
He et al.

(10) Patent No.: US 12,131,247 B2
(45) Date of Patent: Oct. 29, 2024

(54) TRANSFORMER FAILURE DIAGNOSIS METHOD AND SYSTEM BASED ON INTEGRATED DEEP BELIEF NETWORK

(71) Applicant: WUHAN UNIVERSITY, Hubei (CN)

(72) Inventors: Yigang He, Hubei (CN); Chaolong Zhang, Hubei (CN); Guolong Shi, Hubei (CN); Hui Zhang, Hubei (CN); Liulu He, Hubei (CN); Bolun Du, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 985 days.

(21) Appl. No.: 17/126,067

(22) Filed: Dec. 18, 2020

(65) Prior Publication Data
US 2021/0224635 A1    Jul. 22, 2021

(30) Foreign Application Priority Data
Jan. 20, 2020    (CN) .......................... 202010066133.4

(51) Int. Cl.
G06N 3/047    (2023.01)
G06F 17/14    (2006.01)
G06N 3/08    (2023.01)

(52) U.S. Cl.
CPC ............. *G06N 3/047* (2023.01); *G06F 17/14* (2013.01); *G06N 3/08* (2013.01)

(58) Field of Classification Search
CPC ............ G06N 3/047; G06N 3/08; G06N 3/04; G06N 3/02; G06N 20/00; G06F 17/14; G06F 2218/12; G06F 2218/08
(Continued)

(56) References Cited

U.S. PATENT DOCUMENTS

2019/0129405 A1*    5/2019    Cella ...................... H04B 17/23

FOREIGN PATENT DOCUMENTS

| CN | 109214416 A | * | 1/2019 | ........... G06K 9/6269 |
| CN | 109884442 A | * | 6/2019 | |
| CN | 110516757 A | * | 11/2019 | |

OTHER PUBLICATIONS

Xie et al., "Learning Features from High Speed Train Vibration Signals with Deep Belief Networks", 2014 International Joint Conference on Neural Networks (IJCNN), Jul. 2014, pp. 2205-2210. (Year: 2014).*

(Continued)

*Primary Examiner* — Hwei-Min Lu
(74) *Attorney, Agent, or Firm* — JCIPRNET

(57) ABSTRACT

A transformer failure diagnosis method and system based on an integrated deep belief network are provided. The disclosure relates to the fields of electronic circuit engineering and computer vision. The method includes the following: obtaining a plurality of vibration signals of transformers of various types exhibiting different failure types, retrieving a feature of each of the vibration signals, and establishing training data through the retrieved features; training a plurality of deep belief networks exhibiting different learning rates through the training data and obtaining a failure diagnosis correct rate of each of the deep belief networks; and keeping target deep belief networks corresponding to the failure diagnosis correct rates that satisfy requirements, building an integrated deep belief network through each of the target deep belief networks, and performing a failure diagnosis on the transformers through the integrated deep belief network.

8 Claims, 3 Drawing Sheets

(58) Field of Classification Search
USPC .............................................. 706/22, 16, 15
See application file for complete search history.

(56) References Cited

OTHER PUBLICATIONS

Deng et al., "A Novel Weighted Hierarchical Adaptive Voting Ensemble Machine Learning Method for Breast Cancer Detection", 2015 IEEE 45th International Symposium on Multiple-Valued Logic, May 2015, pp. 115-120. (Year: 2015).*

Zhang et al., "Deep Belief Networks Ensemble with Multi-objective Optimization for Failure Diagnosis", 2015 IEEE International Conference on Systems, Man, and Cybernetics, Oct. 2015, pp. 32-37. (Year: 2015).*

Peimankar et al., "Ensemble classifier selection using multi-objective PSO for fault diagnosis of power transformers", 2016 IEEE Congress on Evolutionary Computation (CEC), Jul. 2016, pp. 3622-3629. (Year: 2016).*

Zhang et al., "A Novel Intelligent Fault Diagnosis Method Based On Variational Mode Decomposition And Ensemble Deep Belief Network", IEEE Access, Feb. 2017, pp. 1-20. (Year: 2017).*

Ma et al., "Ensemble deep learning-based fault diagnosis of rotor bearing systems", Computers in Industry 105, available on Dec. 19, 2018, pp. 143-152. (Year: 2018).*

\* cited by examiner

TRANSFORMER FAILURE DIAGNOSIS METHOD AND SYSTEM BASED ON INTEGRATED DEEP BELIEF NETWORK

CROSS-REFERENCE TO RELATED APPLICATION

This application claims the priority benefit of China application serial no. 202010066133.4, filed on Jan. 20, 2020. The entirety of the above-mentioned patent application is hereby incorporated by reference herein and made a part of this specification.

BACKGROUND

Technical Field

The disclosure relates to the fields of electronic circuit engineering and computer vision, and in particular, to a transformer failure diagnosis method and system based on an integrated deep belief network.

Description of Related Art

In a substation, the transformer is one of the major power equipment, and operating of the transformer is directly related to the safety and reliability of the power generation and power supply system. In the long-term operation of the transformer, various failures may inevitably occur, and it is thus necessary to perform transformer failure diagnoses. At present, when a failure diagnosis is performed on a transformer, first, the vibration signal of the transformer is measured. Next, the retrieved vibration signal is processed through using computer algorithms. Finally, a failure identification method is used to distinguish the failures that have occurred. A transformer failure diagnosis method performed through a deep belief network is currently provided. Nevertheless, in this method, a single deep belief network may not guarantee that a failure diagnosis model that may effectively diagnose all types of transformers may be trained, and only a failure diagnosis model that has a preference for certain types of transformers is obtained.

SUMMARY

According to the above technical defects or improvement requirements of the related art, the disclosure provides a transformer failure diagnosis method and system based on an integrated deep belief network to solve the technical problem that a single deep belief network may not be used to effectively diagnose various failure types of transformers.

To realize the above purpose, according to one aspect of the disclosure, a transformer failure diagnosis method based on an integrated deep belief network is provided, and the method includes the following steps. A plurality of vibration signals of transformers of various types exhibiting different failure types are obtained, a feature of each of the vibration signals is retrieved, and training data is established through the feature corresponding to each of the retrieved vibration signals. A plurality of deep belief networks exhibiting different learning rates are trained through the training data, and a failure diagnosis correct rate of each of the deep belief networks is obtained. Target deep belief networks corresponding to the failure diagnosis correct rates that satisfy requirements are kept, an integrated deep belief network is built through each of the target deep belief networks, and a failure diagnosis is performed on the transformers through the integrated deep belief network.

Preferably, the step of retrieving the feature of each of the vibration signals further includes the following. A Fourier transform is performed on each of the vibration signals to obtain a Fourier coefficient of each of the vibration signals, and the Fourier coefficient of each of the vibration signals is normalized to be treated as the feature of each of the vibration signals.

Preferably, each of the deep belief networks are formed by a plurality of restricted Boltzmann machines stacked one-by-one. Each of the restricted Boltzmann machines is formed by 1 visible layer and 1 hidden layer. Each of the visible layers is formed by a plurality of visible layer units, and each of the hidden layers is formed by a plurality of hidden layer units. Herein, the visible layers are input layers of the restricted Boltzmann machines, and the hidden layers are output layers of the restricted Boltzmann machines. The output layer of each of the restricted Boltzmann machines is treated as the input layer of the next restricted Boltzmann machine.

Preferably, the step of training the deep belief networks exhibiting different learning rates through the training data and obtaining the failure diagnosis correct rate of each of the deep belief networks includes the following step. Feature retrieval is performed on the training data by any deep belief network among the deep belief networks, and retrieved data is treated as feature data of the training data. The failure diagnosis correct rate of the deep belief network is obtained based on the feature data of the training data by using a classifier that comes with the deep belief network.

Preferably, the step of performing the feature retrieval on the training data by the deep belief network and treating the retrieved data as the feature data of the training data further includes the following steps. A structure and a parameter of the deep belief network are trained by the training data without supervision. The structure and the parameter of the deep belief network are trained with supervision by using the classifier that comes with the deep belief network and label information of the training data. Herein, the label information is configured to represent a failure type corresponding to each data set in the training data. Layer-by-layer feature retrieval is performed on the training data by using the stacked restricted Boltzmann machines in the deep belief network, and a feature retrieved by the last restricted Boltzmann machine is treated as the feature data of the training data.

Preferably, the step of obtaining the failure diagnosis correct rate of the deep belief network based on the feature data of the training data by using the classifier that comes with the deep belief network includes the following step. The failure diagnosis correct rate of Diagnosis accuracy$_k$ corresponding to a $k^{th}$ deep belief network is obtained through $$\text{Diagnosis accuracy}_k = \frac{N_{kcorrect}}{N_{validating\ data}},$$

where k=1 ... N, N is a number of the deep belief networks, $N_{validating\ data}$ is a number of pieces of the feature data of the training data, $N_{kcorrect}$ is a number of pieces of the feature data correctly identified by the classifier that comes with the $k^{th}$ deep belief network.

Preferably, the step of keeping the target deep belief networks corresponding to the failure diagnosis correct rates that satisfy the requirements and building the integrated deep belief network through each of the target deep belief networks includes the following steps. A mean correct rate Mean diagnosis accuracy of N of the failure diagnosis correct rates are obtained. The deep belief networks corresponding to the failure diagnosis correct rates lower than the mean correct rate Mean diagnosis accuracy are eliminated, the remaining target deep belief networks are obtained. An extra correct rate Extra accuracy$_t$ of a t$^{th}$ target deep belief network is obtained through Extra accuracy$_t$=Diagnosis accuracy$_t$−Mean diagnosis accuracy, where t=1 . . . T, T is a number of the target deep belief networks, and Diagnosis accuracy$_t$ is the failure diagnosis correct rate of the t$^{th}$ target deep belief network. A weight value Weight$_t$ is distributed to the t$^{th}$ target deep belief network through $$\text{Weight}_t = \frac{\text{Extra accuracy}_t}{\sum_{t=1}^{T} \text{Extra accuracy}_t}.$$

The integrated deep belief network is formed through the target deep belief networks together with weight values corresponding thereto.

Preferably, the step of performing the failure diagnosis on the transformers through the integrated deep belief network includes the following steps. A vibration signal of a transformer to be diagnosed is obtained, a feature Xr of the vibration signal of the transformer to be diagnosed is retrieved, and a score Score$_{ru}$ of the transformer to be diagnosed exhibiting a failure u is confirmed through $$\text{Score}_{ru} = \sum_{t=1}^{T} \text{Weight}_t \times \text{Judge}_{tu},$$

where u=1 . . . U, U is a total number of the failure types, and Judge$_{tu}$ is a result of Xr being identified as the failure u by the t$^{th}$ target deep belief network. The failure type corresponding to a highest score is treated as the failure type of the transformer to be diagnosed.

According to another aspect of the disclosure, a transformer failure diagnosis system based on an integrated deep belief network is provided, and the system includes a training data establishment module, a training module, and a diagnosis module. The training data establishment module is configured to obtain a plurality of vibration signals of transformers of various types exhibiting different failure types, retrieve a feature of each of the vibration signals, and establish training data through the retrieved feature. The training module is configured to train a plurality of deep belief networks exhibiting different learning rates through the training data and obtain a failure diagnosis correct rate of each of the deep belief networks. The diagnosis module is configured to keep target deep belief networks corresponding to the failure diagnosis correct rates that satisfy requirements, build an integrated deep belief network through each of the target deep belief networks, and perform a failure diagnosis on the transformers through the integrated deep belief network.

According to another aspect of the disclosure, a computer readable storage medium storing a program instruction is provided. The program instruction implements any one of the transformer failure diagnosis method based on the integrated deep belief network when being executed by a processor.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

To better illustrate the goal, technical solutions, and advantages of the disclosure, the following embodiments accompanied with drawings are provided so that the disclosure are further described in detail. It should be understood that the specific embodiments described herein serve to explain the disclosure merely and are not used to limit the disclosure. In addition, the technical features involved in the various embodiments of the disclosure described below can be combined with each other as long as the technical features do not conflict with each other.

In the embodiments of the disclosure, the terms such as "first", "second", "third", etc. are used to distinguish different objects and are not necessarily used to describe a specific order or sequence.

Figure 1:
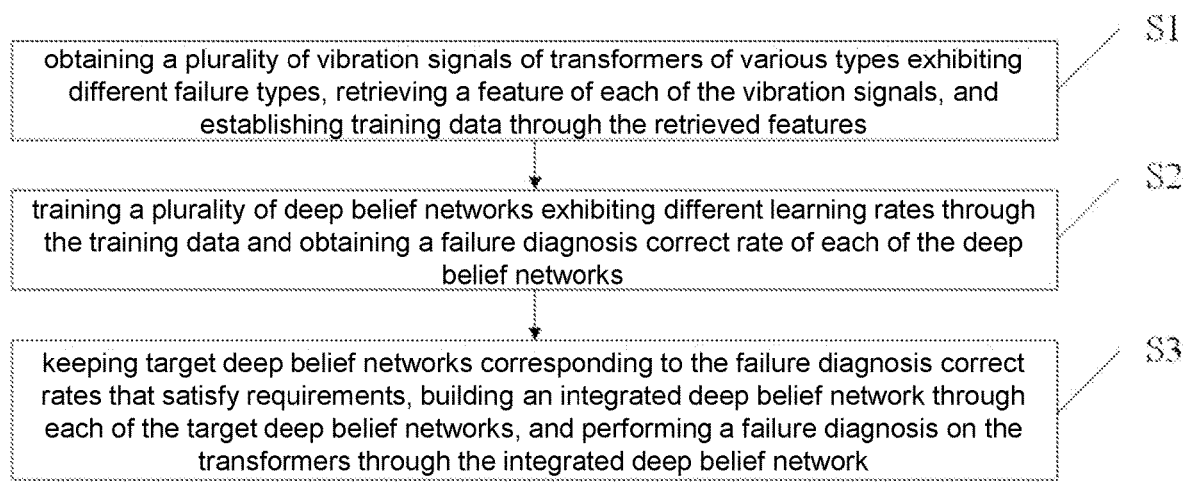
FIG. 1 is a schematic flow chart of a transformer failure diagnosis method according to an embodiment of the disclosure.

The disclosure provides a transformer failure diagnosis method. First, a Fourier transform is applied on a transformer vibration signal to be measured for preliminary processing. Next, through an integrated learning strategy, a plurality of deep belief networks exhibiting different learning rates are combined. A failure diagnosis is performed through an elimination mechanism and a redistribution coefficient mechanism, such that a high failure diagnosis correct rate is obtained FIG. 1 is a schematic flow chart of a transformer failure diagnosis method according to an embodiment of the disclosure and includes the following steps.

S1: A plurality of vibration signals of transformers of various types exhibiting different failure types are obtained, a feature of each of the vibration signals is retrieved, and training data is established through the retrieved feature.

Herein, the vibration signals of the transformers may be obtained through a vibration sensor.

S2: A plurality of deep belief networks exhibiting different learning rates are trained through the training data, and a failure diagnosis correct rate of each of the deep belief networks is obtained.

S3: Target deep belief networks corresponding to the failure diagnosis correct rates that satisfy requirements are kept, an integrated deep belief network is built through each of the target deep belief networks, and a failure diagnosis is performed on the transformers through the integrated deep belief network.

In the embodiments of the disclosure, the feature of each of the vibration signals may be retrieved through the following manners.

A Fourier coefficient of each of the vibration signals may be obtained by applying the Fourier transform, and the Fourier coefficient of each of the vibration signals is then normalized to be treated as the feature of each of the vibration signals, where the Fourier coefficient may be obtained through Formula (1) provided as follow:

$$\begin{cases} a_t = \frac{1}{l}\int_{-l}^{l} f(x)\cos\frac{t\pi x}{l}dx (t = 0, 1, 2, \ldots) \\ b_t = \frac{1}{l}\int_{-l}^{l} f(x)\sin\frac{t\pi x}{l}dx (t = 0, 1, 2, \ldots) \end{cases} \quad (1)$$

where $a_t$ and $b_t$ are Fourier coefficients of a vibration signal $f(x)$, t is a serial number of the Fourier coefficients, and l is a half period of the vibration signal $f(x)$.

In the embodiments of the disclosure, the integrated deep belief network provided in step S3 is an integrated deep belief network generated by the deep belief networks exhibiting different learning rates through a predetermined integrated learning strategy and is configured to perform the failure diagnosis.

In the embodiments of the disclosure, one single deep belief network is formed by a plurality of restricted Boltzmann machines stacked one by one. Each of the restricted Boltzmann machines is formed by 1 visible layer v and 1 hidden layer h. Each of the visible layers v is formed by a plurality of visible layer units, and each of the hidden layers h is formed by a plurality of hidden layer units. The visible layers v are input layers of the restricted Boltzmann machines, the hidden layers h are output layers of the restricted Boltzmann machines, and the output layer of each of the restricted Boltzmann machines is treated as the input layer of the next restricted Boltzmann machine. That is, the hidden layer of the previous restricted Boltzmann machines is the visible layer of the next restricted Boltzmann machine.

Herein, a learning rate of the restricted Boltzmann machines has the following effects on a parameter of the restricted Boltzmann machines:

$$\Delta w_{ji} = \mu(\langle v_i h_j \rangle_0 - v_i h_j \rangle_1) \ \Delta w_{ji} = \mu(\langle v_i h_j \rangle_0 - \langle v_i h_j \rangle_1)$$

$$\Delta b_i = \mu(\langle v_i \rangle_0 - \langle v_i \rangle_1)$$

$$\Delta a_j = \mu(\langle h_j \rangle_0 - \langle h_j \rangle_1) \ \Delta a_j = \mu(\langle v_i \rangle_0 - \langle v_i \rangle_1) \quad (2)$$

where $\Delta w_{ji}$ represents an update amount of a weight matrix connecting an $i^{th}$ visible layer unit $v_i$ and a $j^{th}$ hidden layer unit $h_j$, $\Delta b_i$ represents an update amount of shifting of an $i^{th}$ visible layer unit $v_i$, $\Delta a_j$ represents an update amount of shifting of the $j^{th}$ hidden layer unit $h_j$, $i \in [1, m]$, m is a number of the visible layer units, $j \in [1, n]$, n is a number of the hidden layer units, μ is the learning rate of the restricted Boltzmann machine, $\langle v_i h_j \rangle_0$ represents an actual value of $v_i h_j$, $v_i h_j$ is a degree of correlation between $v_i$ and $h_j$, $\langle v_i h_j \rangle_1$ represents expectation of a probability distribution of a reconstruction value of $v_i h_j$, $\langle h_j \rangle_0$ represents an actual value of the hidden layer unit $h_j$, $\langle h_j \rangle_1$ represents expectation of a probability distribution of a reconstruction value of the hidden layer unit $h_j$, $\langle v_i \rangle_0$ represents an actual value of the visible layer unit $v_i$, and $\langle v_i \rangle_1$ represents expectation of a probability distribution of a reconstruction value of the visible layer unit $v_i$.

Herein, feature retrieval of each of the deep belief networks is divided into three steps, namely pre-training the deep belief network, performing network global fine-adjustment based on a classifier, and implementing feature retrieval. Herein, in the step of pre-training the deep belief network, a model structure and a parameter of the deep belief network are trained without supervision by applying input data, that is, the feature of the vibration signal obtained through the Fourier transform processing in step S1. In the step of performing the network global fine-adjustment based on the classifier, the model structure and the parameter of the deep belief network are trained with supervision by applying the classifier that come with the deep belief network and label information of the input data after the pre-training. Herein, the label information is configured to represent the failure type corresponding to the data. In the step of implementing the feature retrieval, after performance of the network global fine-adjustment based on the classifier is completed, layer-by-layer feature retrieval is performed on the input data by using the stacked restricted Boltzmann machines in the deep belief network, and a feature retrieved by the last restricted Boltzmann machine is treated as the feature retrieved by the deep belief network.

In the embodiments of the disclosure, a number of the deep belief networks exhibiting different learning rates and the learning rates of the deep belief networks may be provided according to actual needs. In the embodiments of the disclosure, the learning rates may be configured to be 0.001, 0.002, 0.005, 0.01, 0.02, 0.05, 0.1, 0.15, 0.2, 0.25, 0.3, 0.35, 0.4, 0.45, and 0.5, that is, a total of 15 learning rates are provided for illustrative description.

Figure 2:
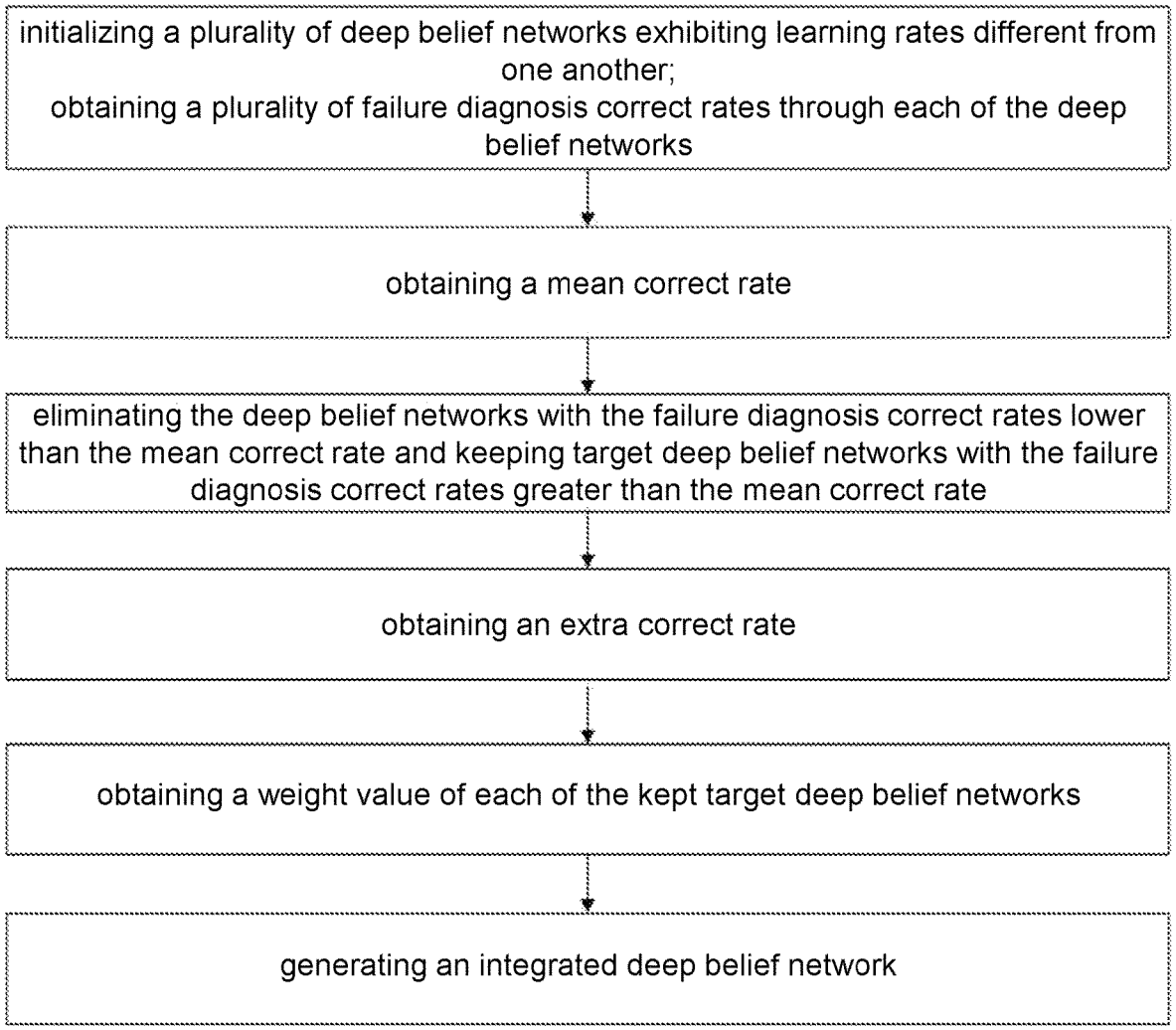
FIG. 2 is a schematic flow chart of a generation process of an integrated deep belief network according to an embodiment of the disclosure.

In the embodiments of the disclosure, a core of the predetermined integrated learning strategy is the elimination mechanism and a weight redistribution mechanism. As shown in FIG. 2, the integrated deep belief network may be accomplished through the following manners.

Step 1: N of the deep belief networks exhibiting different learning rates are tested by applying the input data. Based on the retrieved features, a failure diagnosis correct rate corresponding to each of the deep belief networks may be obtained by applying the classifiers that come with the deep belief networks according to Formula (3) provided below:

$$\text{Diagnosis accuracy}_k = \frac{N_{kcorrect}}{N_{validating\ data}} \quad (3)$$

Herein, k=1 ... N is a serial number corresponding to each of the deep belief networks, N is a number of the deep belief networks, $N_{validating\ data}$ is a number of pieces of feature data retrieved by the deep belief networks, $N_{kcorrect}$ is a number of pieces of feature data correctly identified by the classifiers that come with the deep belief networks, Diagnosis accuracy$_k$ is a failure diagnosis correct rate corresponding to a $k^{th}$ deep belief network.

Step 2: A mean correct rate of Mean diagnosis accuracy of N of the failure diagnosis correct rates is calculated.

Step 3: The elimination mechanism is applied. That is, the deep belief networks corresponding to the failure diagnosis correct rates lower than the mean correct rate of Mean diagnosis accuracy are eliminated in this integration.

Step 4: An extra correct rate of each of the remaining target deep belief networks is obtained:

$$\text{Extra accuracy}_t = \text{Diagnosis accuracy}_t - \text{Mean diagnosis accuracy} \quad (4)$$

where t=1 ... T, T is a number of the remaining target deep belief networks, t is a serial number of the remaining target deep belief networks, and Extra accuracy$_t$ is the extra correct rate of the remaining $t^{th}$ target deep belief network.

Step 5, The weight redistribution mechanism is applied. That is, weight values are distributed to the remaining target deep belief networks according to the extra correct rates:

$$\text{Weight}_t = \frac{\text{Extra accuracy}_t}{\sum_{t=1}^{T}\text{Extra accuracy}_t} \quad (5)$$

where Weight$_t$ is the weight value of the $t^{th}$ remaining target deep belief network.

Step 6: The integrated deep belief network is formed through each of the remaining target deep belief networks together with the weight value corresponding thereto.

In the embodiments of the disclosure, in step S3, the method of adopting the integrated deep belief network to perform the failure diagnosis includes the following.

It is assumed that Xr is a vibration signal of an added transformer to be diagnosed, and a score Score$_{ru}$ of Xr to be determined as having a failure u is:

$$\text{Score}_{ru} = \sum_{t=1}^{T}\text{Weight}_t \times \text{Judge}_{tu} \quad (6)$$

where u=1 ... U, U is a total number of the failure types, Judge$_{tu}$ is a result of Xr being identified as the failure u by the $t^{th}$ target deep belief network, and the score is given according to Formula (7) provided below:

$$\text{Judge}_{tu} \begin{cases} 1, & Xr \text{ identified as failure } u \text{ by } t^{th} \text{ deep belief network} \\ 0, & \text{others} \end{cases}$$

In this way, the failure type of the added input data Xr is eventually determined as a failure v, and a score required to satisfy the failure v is the highest among all failure scores, that is:

$$\text{Score}_{rv} = \arg\max\{\text{Score}_{ru}\} \quad (8)$$

where v∈[1,U].

In the embodiments of the disclosure, the classifiers that come with the deep belief networks are Softmax classifiers.

Figure 3:
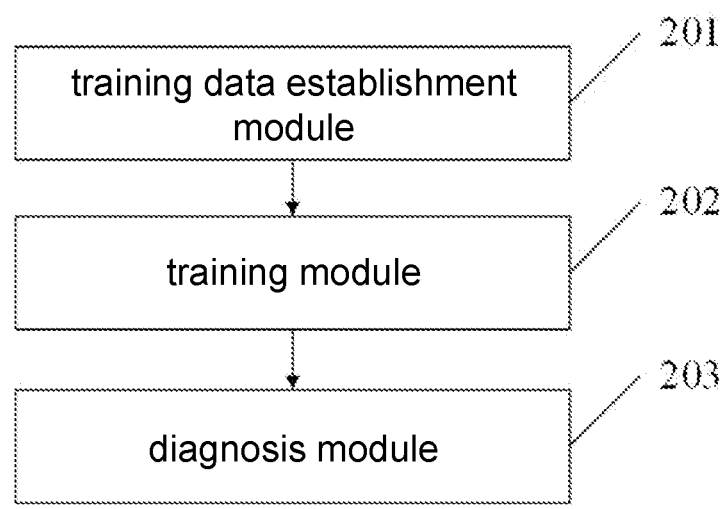
FIG. 3 is a schematic view of a structure of a transformer failure diagnosis system according to an embodiment of the disclosure.

FIG. 3 is a schematic view of a structure of a transformer failure diagnosis system according to an embodiment of the disclosure. The transformer failure diagnosis system includes a training data establishment module 201, a training module 202, and a diagnosis module 203. The training data establishment module 201 is configured to obtain a plurality of vibration signals of transformers of various types exhibiting different failure types, retrieve a feature of each of the vibration signals, and establish training data through the retrieved feature. The training module 202 is configured to train a plurality of deep belief networks exhibiting different learning rates through the training data and obtain a failure diagnosis correct rate of each of the deep belief networks. The diagnosis module is configured to keep target deep belief networks corresponding to the failure diagnosis correct rates that satisfy requirements, build an integrated deep belief network through each of the target deep belief networks, and perform a failure diagnosis on the transformers through the integrated deep belief network. Herein, specific implementation of each of the modules may be found with reference to the description provided above, and description thereof is not provided in the embodiments of the disclosure.

The embodiments of the disclosure further provide a computer readable storage medium storing a program instruction. The program instruction implements any one of the transformer failure diagnosis method based on the integrated deep belief network when being executed by a processor.

Description of the failure diagnosis of one transformer is provided as follows to further describe the transformer failure diagnosis method based on the integrated deep belief network provided by the disclosure.

Experimental verification of the provided failure diagnosis method is performed through a 10 kV three-phase transformer.

Vibration signal data of the measured 10 kV transformer is acceleration signal data. That is, a frequency is a sine wave of 100 HZ, a half period is 0.005 s, and an amplitude is 2.7 m/s$^2$. The first 128 Fourier coefficients of the transformer vibration signal may be calculated through a Fourier transform. The failure types of this transformer are configured as shown in Table 1 and include a total of nine failure types including no failure, winding deformation failure, winding nesting failure, winding loosening failure, iron core deformation failure, winding deformation and iron core deformation double failure, winding nesting and iron core deformation double failure, winding loosening and iron core deformation double failure, and winding deformation, winding nesting, and iron core deformation triple failure. 240 pieces of data are connected for each failure type. 150 pieces of data of each failure are gathered to act as training data configured to train an integrated deep belief network. The remaining 90 pieces of data of each failure are gathered to act as testing data configured to test performance of the trained integrated deep belief network.

TABLE 1

| Transformer Failure Type | |
|---|---|
| Serial Number | Failure Type |
| F0 | no failure |
| F1 | winding deformation failure |
| F2 | winding nesting failure |
| F3 | winding loosening failure |
| F4 | iron core deformation failure |
| F5 | winding deformation and iron core deformation double failure |
| F6 | winding nesting and iron core deformation double failure |
| F7 | winding loosening and iron core deformation double failure |
| F8 | winding deformation, winding nesting, and iron core deformation triple failure |

Three restricted Boltzmann machines are adopted for one deep belief network. A first restricted Boltzmann machine is formed by a visible layer and a first hidden layer, a second restricted Boltzmann machine is formed by the first hidden layer and a second hidden layer, and a third restricted Boltzmann machine is formed by the second hidden layer and a third hidden layer. Numbers of units of the first, the second, and the third hidden layers respectively are 64, 32, and 16. 15 deep belief networks are configured, and the learning rates thereof are configured to 0.001, 0.002, 0.005, 0.01, 0.02, 0.05, 0.1, 0.15, 0.2, 0.25, 0.3, 0.35, 0.4, 0.45, and 0.5 as shown as follows:

deep belief network 1: learning rate 0.001,
deep belief network 2: learning rate 0.002,
deep belief network 3: learning rate 0.005,
deep belief network 4: learning rate 0.01,
deep belief network 5: learning rate 0.02,
deep belief network 6: learning rate 0.05,
deep belief network 7: learning rate 0.1,
deep belief network 8: learning rate 0.15,
deep belief network 9: learning rate 0.2,
deep belief network 10: learning rate 0.25,
deep belief network 11: learning rate 0.3,
deep belief network 12: learning rate 0.35,
deep belief network 13: learning rate 0.4,
deep belief network 14: learning rate 0.45, and
deep belief network 15: learning rate 0.5.

These 15 deep belief networks are used to train the training data, and the results are provided as shown in Table 2 as follows.

TABLE 2

Integrated Learning Model Establishment Process of Integrated Deep Belief Network

| Serial Number | Correct Rate (%) | Mean Correct Rate (%) | Operation | Weight Redistribution |
|---|---|---|---|---|
| deep belief network 1 | 96.17 | 95.89 | kept | 0.030 |
| deep belief network 2 | 94.92 | | eliminated | — |
| deep belief network 3 | 96.67 | | kept | 0.084 |
| deep belief network 4 | 98.00 | | kept | 0.228 |
| deep belief network 5 | 94.83 | | eliminated | — |
| deep belief network 6 | 97.08 | | kept | 0.129 |
| deep belief network 7 | 96.08 | | kept | 0.021 |
| deep belief network 8 | 97.83 | | kept | 0.210 |
| deep belief network 9 | 97.00 | | kept | 0.120 |
| deep belief network 10 | 96.58 | | kept | 0.075 |
| deep belief network 11 | 95.08 | | eliminated | — |
| deep belief network 12 | 96.83 | | kept | 0.102 |
| deep belief network 13 | 94.83 | | eliminated | — |
| deep belief network 14 | 93.75 | | eliminated | — |
| deep belief network 15 | 92.67 | | eliminated | — |

The integrated deep belief network established in this manner is used to perform the failure diagnosis on failure data of transformers. A total of 720 pieces of testing data are provided, 7 pieces are incorrectly identified, and the correct rate is 99.03%, which is more favorable than that provided by any one of the deep belief networks with the learning rates configured to be 0.001, 0.002, 0.005, 0.01, 0.02, 0.05, 0.1, 0.15, 0.2, 0.25, 0.3, 0.35, 0.4, 0.45, and 0.5.

In general, the above technical solutions provided by the disclosure have the following beneficial effects compared with the related art. The method of integrating plural deep belief networks for failure diagnosis provided by the disclosure is more favorable than the method of using a single deep belief network for failure diagnosis. Through the integrated learning strategy, plural deep belief networks exhibiting different learning rates are combined. The adopted elimination mechanism and redistribution coefficient mechanism are more favorable than the elimination mechanism and weight value redistribution mechanism provided by other integrated learning methods. In this way, the problem that a single deep belief network may not be used to effectively diagnose various failure types of transformers is solved, and the diagnosis correct rates of failure diagnoses of various types of transformers are therefore effectively increased.

Note that according to implementation requirements, each step/part described in the disclosure may be further divided into more steps/parts, or two or more steps/parts or partial operations of a step/part may be combined into a new step/part to accomplish the goal of the disclosure.

According to the above, the method provided by the disclosure may be accomplished in hardware and firmware, may be implemented as software or a computer code that may be stored in a recording medium (e.g., CD ROM, RAM, floppy disk, hard disk, or magneto-optical disk), or may be accomplished through a computer code originally stored in a remote recording medium or a non-transitory machine-readable medium through network downloading and to be stored in a local recording medium. In this way, the method described herein may be processed by software stored on a recording medium using a general-purpose computer, a dedicated processor, or programmable or dedicated hardware (e.g., ASIC or FPGA). It may be understood that a computer, a processor, a microprocessor controller, or programmable hardware includes a storage component (e.g., RAM, ROM, flash memory, etc.) that may store or receive software or a computer code. When the software or computer code is accessed and executed by a computer, a processor, or hardware, the processing method described herein is realized. In addition, when a general-purpose computer accesses the code for implementing the processing shown herein, execution of the code converts the general-purpose computer into a dedicated computer for executing the processing shown herein.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A transformer failure diagnosis method based on an integrated deep belief network, comprising:
    obtaining a plurality of vibration signals of transformers of various types exhibiting different failure types, retrieving a feature of each of the vibration signals, and establishing training data through the feature retrieved corresponding to each of the vibration signals;
    training a plurality of deep belief networks exhibiting different learning rates through the training data and obtaining a failure diagnosis correct rate of each of the deep belief networks; and
    keeping target deep belief networks corresponding to the failure diagnosis correct rates that satisfy requirements, building the integrated deep belief network through each of the target deep belief networks, further comprising:
        obtaining a mean correct rate Mean diagnosis accuracy of N of the failure diagnosis correct rates, N is a number of the deep belief networks;
        eliminating the deep belief networks corresponding to the failure diagnosis correct rates lower than the mean correct rate Mean diagnosis accuracy and obtaining the remaining target deep belief networks;
        obtaining an extra correct rate Extra accuracy$_t$ of a $t^{th}$ target deep belief network through Extra accuracy$_t$=Diagnosis accuracy$_t$−Mean diagnosis accuracy, wherein t=1 . . . T, T is a number of the target deep belief networks, and Diagnosis accuracy$_t$ is the failure diagnosis correct rate of the t$^{th}$ target deep belief network;

distributing a weight value Weight$_t$ to the t$^{th}$ target deep belief network through $$Weight_t = \frac{\text{Extra accuracy}_t}{\sum_{t=1}^{T} \text{Extra accuracy}_t};$$

and forming the integrated deep belief network through the target deep belief networks together with weight values corresponding thereto, and performing a failure diagnosis on the transformers through the integrated deep belief network.

2. The method according to claim 1, wherein the step of retrieving the feature of each of the vibration signals further comprises:

performing a Fourier transform on each of the vibration signals to obtain a Fourier coefficient of each of the vibration signals and normalizing the Fourier coefficient of each of the vibration signals to be treated as the feature of each of the vibration signals.

3. The method according to claim 1, wherein each of the deep belief networks is formed by a plurality of restricted Boltzmann machines stacked one-by-one, each of the restricted Boltzmann machines is formed by 1 visible layer and 1 hidden layer, each of the visible layers is formed by a plurality of visible layer units, and each of the hidden layers is formed by a plurality of hidden layer units, wherein the visible layers are input layers of the restricted Boltzmann machines, the hidden layers are output layers of the restricted Boltzmann machines, and the output layer of each of the restricted Boltzmann machines is treated as the input layer of the next restricted Boltzmann machine.

4. The method according to claim 3, wherein the step of training the deep belief networks exhibiting the different learning rates through the training data and obtaining the failure diagnosis correct rate of each of the deep belief networks comprises:

performing feature retrieval on the training data by a deep belief network among the deep belief networks and treating retrieved data as feature data of the training data; and obtaining the failure diagnosis correct rate of the deep belief network based on the feature data of the training data by using a classifier that comes with the deep belief network.

5. The method according to claim 4, wherein the step of performing the feature retrieval on the training data by the deep belief network and treating the retrieved data as the feature data of the training data comprises:

training a structure and a parameter of the deep belief network by the training data without supervision;

training the structure and the parameter of the deep belief network with supervision by using the classifier that comes with the deep belief network and label information of the training data, wherein the label information is configured to represent a failure type corresponding to each data set in the training data; and performing layer-by-layer feature retrieval on the training data by using the stacked restricted Boltzmann machines in the deep belief network and treating a feature retrieved by the last restricted Boltzmann machine as the feature data of the training data.

6. The method according to claim 5, wherein the step of obtaining the failure diagnosis correct rate of the deep belief network based on the feature data of the training data by using the classifier that comes with the deep belief network comprises:

obtaining the failure diagnosis correct rate of Diagnosis accuracy$_k$ corresponding to a k$^{th}$ deep belief network through $$\text{Diagnosis accuracy}_k = \frac{N_{kcorrect}}{N_{validating\ data}},$$

wherein k=1 . . . N, N$_{validating\ data}$ is a number of pieces of the feature data of the training data, N$_{kcorrect}$ is a number of pieces of the feature data correctly identified by the classifier that comes with the k$^{th}$ deep belief network.

7. The method according to claim 1, wherein the step of performing the failure diagnosis on the transformers through the integrated deep belief network comprises:

obtaining a vibration signal of a transformer to be diagnosed, retrieving a feature X$_r$ of the vibration signal of the transformer to be diagnosed, and confirming a score Score$_{ru}$ of the transformer to be diagnosed exhibiting a failure u through $$Score_{ru} = \sum_{t=1}^{T} Weight_t \times Judge_{tu},$$

wherein u=1 . . . U, U is a total number of the failure types, and Judge$_{tu}$ is a result of Xr being identified as the failure u by the t$^{th}$ target deep belief network; and treating one failure type corresponding to a highest score as a failure type of the transformer to be diagnosed.

8. A transformer failure diagnosis system based on an integrated deep belief network, comprising:

a training data establishment module, configured to obtain a plurality of vibration signals of transformers of various types exhibiting different failure types, retrieve a feature of each of the vibration signals, and establish training data through the retrieved feature;

a training module, configured to train a plurality of deep belief networks exhibiting different learning rates through the training data and obtain a failure diagnosis correct rate of each of the deep belief networks; and a diagnosis module, configured to keep target deep belief networks corresponding to the failure diagnosis correct rates that satisfy requirements, build the integrated deep belief network through each of the target deep belief networks, by:

obtaining a mean correct rate Mean diagnosis accuracy of N of the failure diagnosis correct rates, N is a number of the deep belief networks;

eliminating the deep belief networks corresponding to the failure diagnosis correct rates lower than the mean correct rate Mean diagnosis accuracy and obtaining the remaining target deep belief networks;

obtaining an extra correct rate Extra accuracy$_t$ of a t$^{th}$ target deep belief network through Extra accuracy$_t$=Diagnosis accuracy$_t$−Mean diagnosis accuracy, wherein t=1 . . . T, T is a number of the target deep belief networks, and Diagnosis accuracy, is the failure diagnosis correct rate of the $t^{th}$ target deep belief network;

distributing a weight value $Weight_t$ to the $t^{th}$ target deep belief network through $$Weight_t = \frac{\text{Extra accuracy}_t}{\sum_{t=1}^{T}\text{Extra accuracy}_t};$$

and forming the integrated deep belief network through the target deep belief networks together with weight values corresponding thereto, and perform a failure diagnosis on the transformers through the integrated deep belief network.

\* \* \* \* \*